US007336093B2

(12) United States Patent
Uei et al.

(10) Patent No.: US 7,336,093 B2
(45) Date of Patent: Feb. 26, 2008

(54) TEST CIRCUIT FOR FLAT PANEL DISPLAY DEVICE

(75) Inventors: Guo-Feng Uei, Hsinchu (TW); Ming-Sheng Lai, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 11/301,479

(22) Filed: Dec. 12, 2005

(65) Prior Publication Data

US 2007/0046316 A1 Mar. 1, 2007

(30) Foreign Application Priority Data

Aug. 26, 2005 (TW) .............................. 94129200 A

(51) Int. Cl.
*G01R 31/00* (2006.01)

(52) U.S. Cl. ...................................................... 324/770

(58) Field of Classification Search ................ 324/770; 349/40

See application file for complete search history.

(56) References Cited

U.S. PATENT DOCUMENTS

| | | | | |
|---|---|---|---|---|
| 5,852,480 | A | 12/1998 | Yajima et al. | 349/40 |
| 6,184,948 | B1 * | 2/2001 | Lee | 349/54 |
| 6,246,074 | B1 | 6/2001 | Kim et al. | 257/48 |
| 6,392,719 | B2 * | 5/2002 | Kim | 349/40 |
| 6,801,265 | B2 | 10/2004 | Choi et al. | 349/40 |
| 7,149,343 | B2 * | 12/2006 | Enachescu et al. | 382/149 |

FOREIGN PATENT DOCUMENTS

| | | | |
|---|---|---|---|
| CN | 1556436 | A | 12/2004 |
| CN | 1740852 | A | 3/2006 |

* cited by examiner

*Primary Examiner*—Ha Tran Nguyen
*Assistant Examiner*—Roberto Velez
(74) *Attorney, Agent, or Firm*—J.C. Patents

(57) ABSTRACT

A test circuit for a flat panel display device is provided. The test circuit includes a substrate, a plurality of pixel structures, a plurality of signal lines and a plurality of shorting bar sets. The substrate includes at least one scan side, at least one data side and a pixel area. Each pixel structure formed in the pixel area having n sub-pixels, where n is a positive integer. The signal lines are formed on the substrate, and each signal line is connected to a corresponding sub-pixel. Each shorting bar set is formed on at least one of the at least one scan side and the at least one data side, wherein the shorting bar sets are electrically connected to the signal lines.

19 Claims, 5 Drawing Sheets

TEST CIRCUIT FOR FLAT PANEL DISPLAY DEVICE

CROSS-REFERENCE TO RELATED APPLICATION

This application claims the priority benefit of Taiwan application Serial No. 94129200, filed on Aug. 26, 2005. All disclosure of the Taiwan application is incorporated herein by reference.

BACKGROUND OF THE INVENTION

1. Field of the Invention

The present invention relates to a test circuit for a flat panel display device, and more particularly, to a test circuit capable of separately testing signal lines and pixels on a substrate of a flat panel display device in different groups.

2. Description of the Related Art

There are different types of flat panel devices (FPD) in the current market, such as the liquid crystal display (LCD), the organic light-emitting diode (OLED) and the plasma display panel (PDP). However, for all kinds of the flat panel display devices, testing the signal lines (e.g. the scan lines and the data lines) and the pixels is a mandatory process when manufacturing the display panel so that the normal operation of the manufactured flat panel display device can be ensured.

The full contact test method and the shorting bar test method are the two methods commonly used to test the signal lines and the pixels on the display panel. Although the full contact testing method can test every signal line and every pixel on the display panel, its testing equipment and the probes are excessively expensive, thus the shorting bar test method is generally used.

Figure 1:
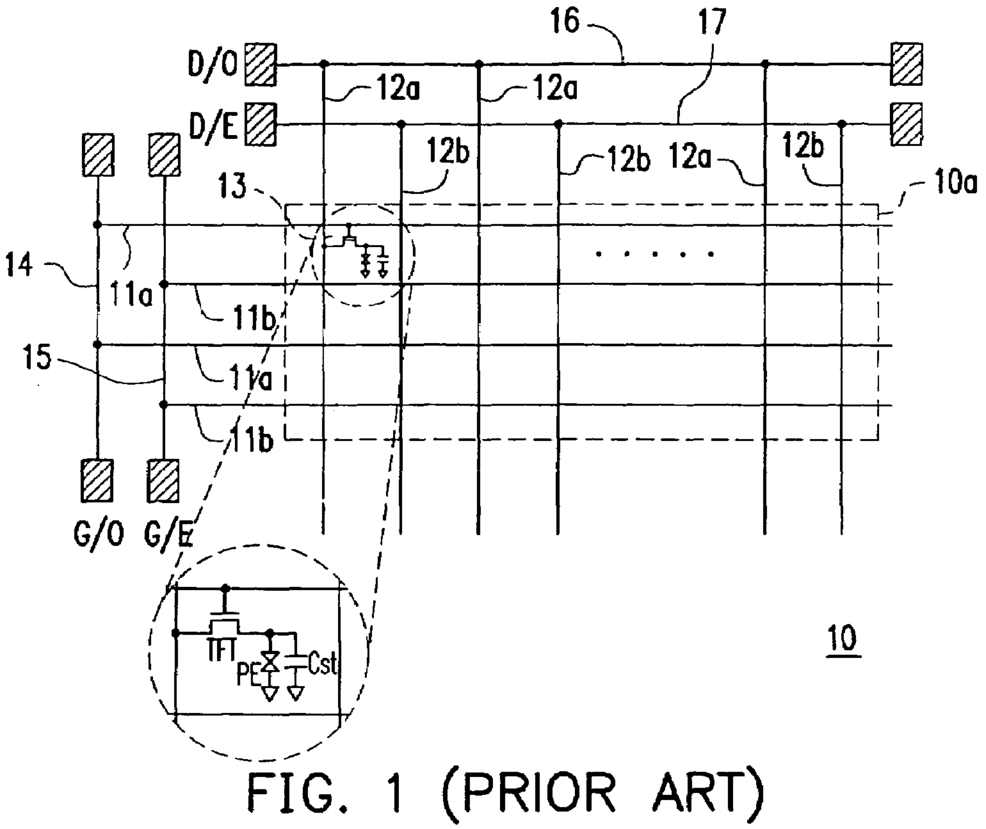
FIG. 1 (PRIOR ART)

FIG. 1 schematically shows a circuit for testing the LCD by using the shorting bar test method disclosed in U.S. Pat. No. 5,852,480. Referring to FIG. 1, a plurality of scan lines 11*a*~11*b* and a plurality of data lines 12*a*~12*b* are intersecting to form on a substrate 10 of the LCD, and a pixel structure 13 is disposed on every intersection of the scan line and the data line. Here, a monochrome LCD is exemplified in FIG. 1, where each pixel structure 13 comprises a thin-film transistor TFT, a pixel electrode PE and a storage capacitor Cst. Wherein, the thin-film transistor TFT is coupled to the scan line and the data line.

The shorting bar 14 is coupled to one end of the odd number scan line 11*a*, the shorting bar 15 is coupled to one end of the even number scan line 11*b*. When the test signal is input into the shorting bar 14 through a testing pad G/O, a test result is received at the other end of the odd number scan line 11*a*. When the test signal is input into the shorting bar 15 through another testing pad G/E, a test result is received at the other end of the even number scan line 11*b*. Similarly, the shorting bars 16 and 17 are respectively coupled to the odd number data line 12*a* and the even number data line 12*b* for testing the odd number data lines and the even number data lines. Accordingly, the signal lines 11*a*~11*b* and 12*a*~12*b* and the pixel 13 can be separately tested in different groups by using the shorting bars 14~17.

After the test is completed, it is common that the electrical connection between the signal lines on the shorting bars 14~17 and the substrate 10*a* is cut off by laser, or in some cases, even the portion outside of the substrate 10*a* is cut off and the substrate 10*a* is the only one that remains. However, in the invention disclosed in U.S. Pat. No. 6,100,949, a switch device is configured between the shorting bar and the signal line. In such invention, the connection between the shorting bar and the signal line is turned on by the switch device during testing the signal lines or the pixels. On the other hand, once the test is completed, the connection between the shorting bar and the signal line is turned off by the switch device. Accordingly, an additional step of cutting off the connection is not required in the manufacturing process, and the price may be the increase of the size of the LCD.

Figure 2:
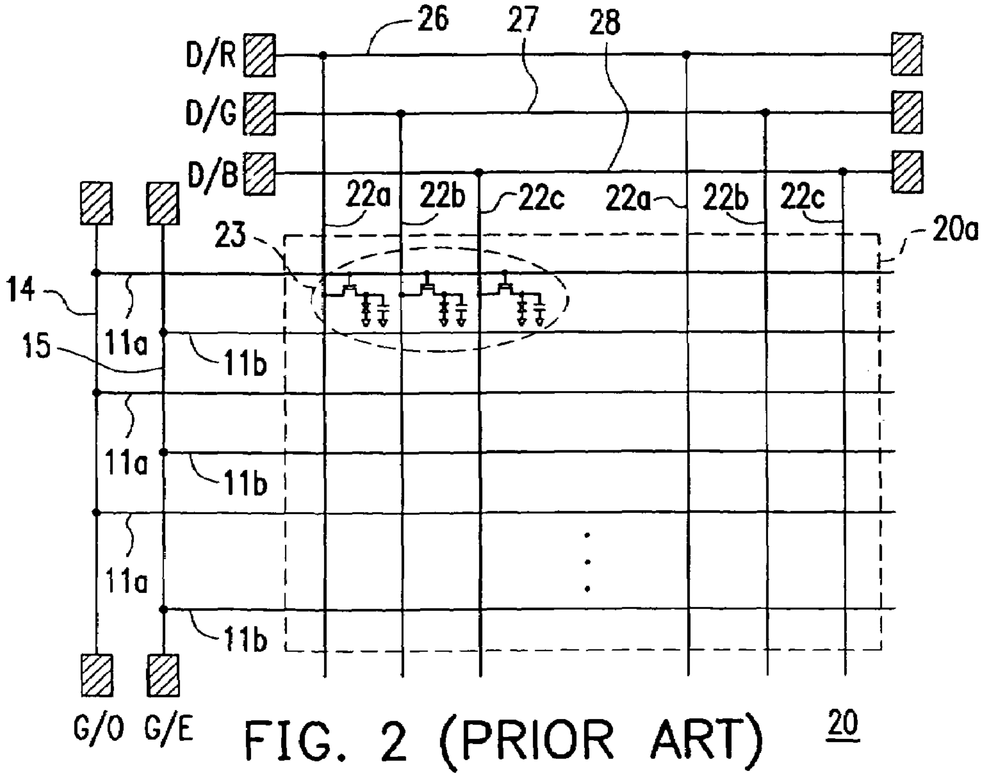
FIG. 2 (PRIOR ART) 20

FIG. 2 schematically shows a circuit for testing the LCD by using the shorting bar test method disclosed in U.S. Pat. No. 6,392,719. Referring to FIG. 2, a color LCD is exemplified in it, where each pixel structure 23 comprises R, G, B three sub-pixels, wherein each sub-pixel comprises a thin-film transistor TFT, a pixel electrode PE and a storage capacitor Cst.

Moreover, the substrate 20 of the LCD is very similar to the substrate 10 in FIG. 1, and the difference is that the data lines of the substrate 10 are separately tested in an odd number group and in an even number group (that is why two shorting bars 16~17 are required), whereas the data lines of the substrate 20 are separately tested in R, G, B groups (that is why three shorting bars 26~28 are required). Therefore, the display characteristics of R, B, G sub-pixels on the LCD can be respectively tested.

For an easy explanation, the design of the shorting bar shown in FIG. 1 is generally referred to as a 2G2D design, and the design of the shorting bar shown in FIG. 2 is referred to as a 2G3D design. In addition, other shorting bar designs, such as the shorting bar designs disclosed in U.S. Pat. Nos. 6,246,074 and 6,801,265 are the modifications of the 2G2D or 2G3D designs. Since the demand for an LCD display quality is higher and higher, the conventional shorting bar design cannot provide more diverse test patterns such as the window or color-bar test pattern to determine the existence of crosstalk and flicker, etc., thus the risk of the product defect is higher.

SUMMARY OF THE INVENTION

Therefore, it is an object of the present invention to provide a test circuit for a flat panel display device. The test circuit aims to provide various test patterns for determining the existence of crosstalk and flicker, etc., so as to reduce the risk of the product defect.

In order to achieve the object mentioned above and others, the preset invention provides a test circuit for a flat panel display device. The test circuit includes a substrate, a plurality of pixel structures, a plurality of signal lines, a plurality of shorting bar sets and a plurality of shorting bar buses. The substrate includes at least one scan side, at least one data side and a pixel area. Each pixel structure formed in the pixel area has n sub-pixels, where n is a positive integer. The signal lines are formed on the substrate, and each signal line is connected to a corresponding sub-pixel. Each shorting bar set is formed on at least one of the at least one scan side and the at least one data side, wherein the shorting bar sets are electrically connected to the signal lines and each shorting bar set is disconnected from each other. The shorting bar buses being electrically connected to the shorting bar sets. In an embodiment of the present invention, the signal lines comprise a plurality of data lines and a plurality of scan lines. In addition, each shorting bar set includes p shorting bars, and each shorting bar set is electrically connected to p*m data lines, where p=k*n, m is a positive integer, and k=1 or 2.

In an embodiment of the present invention, the shorting bar buses comprise even data shorting bar buses. The even data shorting bar buses are formed on at least one data side, and each even data shorting bar bus includes at least one testing pad which is adapted to receive a testing signal. Moreover, the p shorting bars of each shorting bar set are electrically connected to the even data shorting bar buses, respectively.

In an embodiment of the present invention, the shorting bar buses comprise odd data shorting bar buses. The odd data shorting bar buses are formed on at least one data side, and each odd data shorting bar bus includes at least one testing pad which is adapted to receive the testing signal. Moreover, the p shorting bars of each shorting bar set are electrically connected to the odd data shorting bar buses, respectively.

From another aspect of the present invention, the preset invention provides a test circuit for a flat panel display device. The test circuit includes a substrate, a plurality of pixel structures, a plurality of data lines, a plurality of scan lines, a plurality of scan shorting bar sets and a plurality of shorting bar buses. Wherein, the substrate includes at least one scan side and a pixel area. Each pixel structure formed in the pixel area has n sub-pixels, where n is a positive integer. Each data line formed on the substrate is connected to a corresponding sub-pixel. The scan lines formed on the substrate are substantially intersected with the data lines. The scan shorting bar sets formed on the at least one scan side are electrically connected to the scan lines and each shorting bar set is disconnected from each other. In an embodiment of the present invention, each scan shorting bar set includes p' shorting bars, and each scan shorting bar set is electrically connected to p'*m' scan lines, where p' is greater than or equal to 2, and m is a positive integer. In addition, the test circuit may further comprise at least one data side formed on the substrate. The at least one data side electrically connected to the data lines comprises a plurality of data shorting bar sets. In an embodiment of the present invention, each data shorting bar set includes p shorting bars, and each shorting bar set is electrically connected to p*m data lines, where p=k*n, m is a positive integer, and k=1 or 2.

In summary, since different sets of open shorting bars are utilized in the present invention, the test signals can be input into different sets of the shorting bars, such that more various test patterns can be provided for determining the existence of crosstalk and flicker, etc., which reduces the risk of the product defect.

BRIEF DESCRIPTION DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 1 schematically shows a conventional circuit for testing the LCD by using a shorting bar test method (2G2D).

FIG. 2 schematically shows a conventional circuit for testing the LCD by using another shorting bar test method (2G3D).

Figure 3:
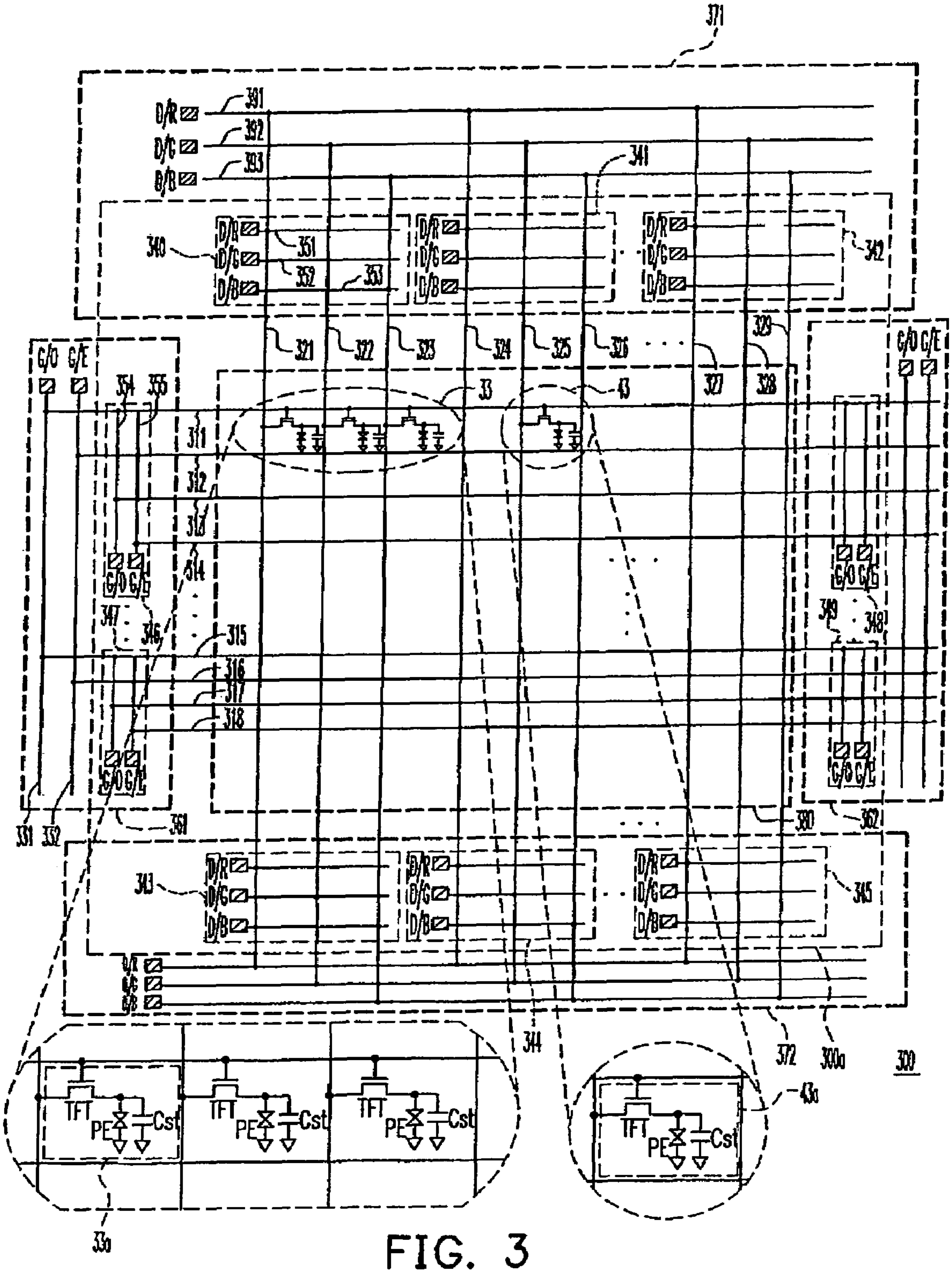

FIG. 3 schematically shows a test circuit for the LCD according to a preferred embodiment of the present invention.

Figure 4:
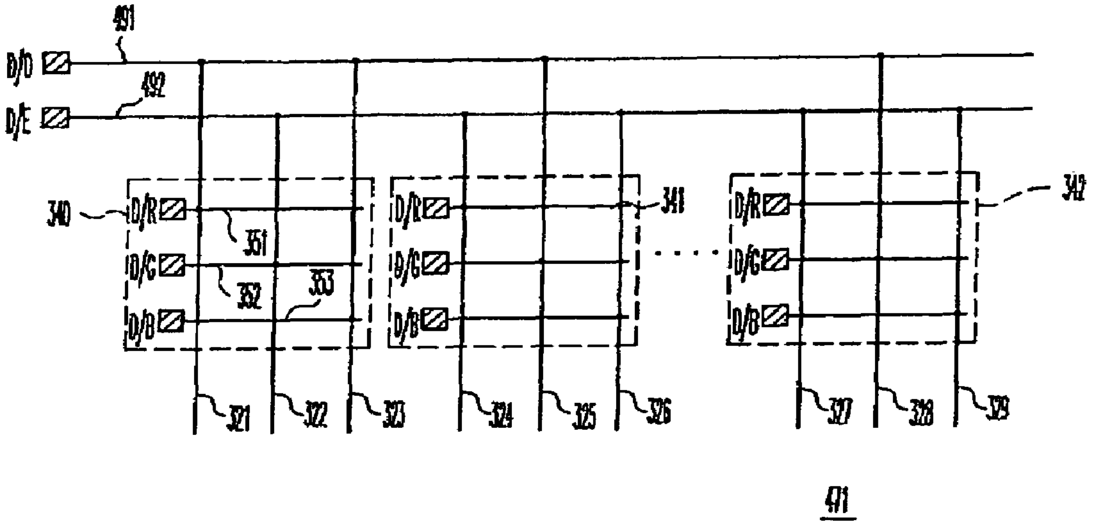

FIG. 4 schematically shows another embodiment of the data side in FIG. 3.

FIGS. 5A~5D schematically show more embodiments of the data side in FIG. 3.

DESCRIPTION PREFERRED EMBODIMENTS

In order to have a better understanding of how to implement the present invention, an LCD used as a flat panel display device is exemplified hereinafter. FIG. 3 schematically shows a test circuit for the LCD according to an embodiment of the present invention. Referring to FIG. 3, a substrate 300 of the LCD comprises the scan sides 361~362, the data sides 371~372 and a pixel area 380. The test circuit comprises the substrate 300, the signal lines 311~318 and 321~329, a pixel structure 33 or 43 and the shorting bar sets 340~349.

The signal lines comprise the scan lines 311~318 and the data lines 321~329, and the scan lines 311~318 and the data lines 321~329 are intersecting to form on the substrate 300. In addition, a sub-pixel **33*a* or 43*a* is disposed on every intersection of the scan line 311~318 and the data line 321~329. Each sub-pixel 33*a* or 43*a* comprises a thin-film transistor TFT, a pixel electrode PE and a storage capacitor Cst. The pixel structure 43 or 33 formed in the pixel area 380 has one sub-pixels 43*a*, and which may be designed as the pixel structure 13 as shown in FIG. 1. In other words, the pixel area 380 has n sub-pixels, where n is a positive integer. In such case, this pixel structure 43 may be suitable for a monochrome LCD or polychrome LCD. In addition, the pixel structure 33 formed in the pixel area 380 has at least three sub-pixels 33*a*, and which may be designed as the pixel structure 23 as shown in FIG. 2. In such case, for example, the pixel structure 33** is suitable for an LCD with R, G and B tricolor spaces.

The shorting bar sets 340~342 are formed on the data side 371, the shorting bar sets 343~345 are formed on the data side 372, the shorting bar sets 346~347 are formed on the scan side 361 and the shorting bar sets 348~349 are formed on the scan side 362. The shorting bar sets 340~349 are disconnected from each other if the shorting bar buses are not used. For example, the shorting bar set 340 is disconnected from the shorting bar set 341 if the shorting bar bus 391, 392, or 393 is not used. Similarly, the shorting bar set 346 is disconnected from the shorting bar set 347 if the shorting bar bus 331 or 332 is not used.

For the data side, the shorting bar sets 340~342 on the data side 371 is exemplified herein. Each shorting bar set includes p shorting bars, and each shorting bar set is electrically connected to p*m data lines, where p=k*n, m is a positive integer, and k=1 or 2. For example, in the present embodiment, n=3, k=1, m=1, thus p=3 and p*m=3. In other words, for example, the shorting bar set 340 includes three shorting bars 351~353, and the shorting bar set 340 is electrically connected to three data lines 321~323 (wherein the shorting bar 351 is electrically connected to the data line 321, the shorting bar 352 is electrically connected to the data line 322, and the shorting bar 353 is electrically connected to the data line 323). Certainly, in order to test the data lines 321~323 or the connected sub-pixels by inputting the test signals through the shorting bars 351~353, the shorting bars 351~352 are electrically connected to the testing pads D/R, D/G and D/B, respectively.

Moreover, in addition to the shorting bar sets already disposed on the data side, a plurality of data shorting bar buses may be further disposed on the data side. For example, besides the shorting bar sets 340~342 already disposed on the data side 371, odd data shorting bar buses 391~393 may be further disposed outside of the substrate **300*a*. Three data shorting bar buses are exemplified in the present embodiment. Moreover, the shorting bars 351~353 within the shorting bar set 340 are electrically connected to the data shorting bar buses 391~393, respectively. Furthermore, the shorting bars 351~353** are electrically connected to the testing pads D/R, D/G and D/B in order to receive the testing signal, respectively.

Similarly, for the scan side, the shorting bar sets 346~347 on the scan side 361 are exemplified herein. Each scan shorting bar set includes p' shorting bars, and each shorting bar set is electrically connected to p'*m' scan lines, where p' is greater than or equal to 2, and m is a positive integer. For example, in the present embodiment, p'=2, m'=2, thus p'*m'=4. In other words, for example, the shorting bar set 346 includes 2 shorting bars 354~355, and the shorting bar set 346 is electrically connected to 4 scan lines 311~314 (wherein the shorting bar 354 is electrically connected to the scan lines 311 and 313, and the shorting bar 355 is electrically connected to the scan lines 312 and 314). Here, the scan lines 311~314 are electrically connected to the shorting bars 354 or 355 depending on whether it is an odd number or an even number. However, the scan lines 311~314 may be electrically connected to the shorting bars 354~355 by using different ordering, grouping or other connection methods.

Furthermore, in addition to the shorting bar sets already disposed on the scan side, a plurality of scan shorting bar buses may be further disposed on the scan side. For example, besides the shorting bar sets 346~347 already disposed on the scan side 361, at least two scan shorting bar buses 331~332 may be farther disposed outside of the substrate 300*a*. Two scan shorting bar buses are exemplified in the present embodiment. Moreover, the shorting bars 354~355 within the shorting bar set 346 are electrically connected to the scan shorting bar buses 331~332, respectively. However, the shorting bars 354~355 may be electrically connected by using different ordering, grouping, or other connection methods. Furthermore, the shorting bars are electrically connected to the testing pads G/O and G/E in order to receive the testing signal, respectively.

In the present embodiment, although the scan sides 361~362 are disposed on both sides of the pixel area 380, and the data sides 371~372 are disposed on both sides above and below the pixel area 380. However, the arrangement of the scan sides and the data sides are not necessarily limited by it. The design of the scan sides and the data sides may be modified according to the physical requirement. For example, it is also possible that the scan side 361 is disposed on the left,side of the pixel area 380 and the data side 372 is disposed below the pixel area 380. Alternatively, the scan side 362 may be disposed on the right side of the pixel area 380 and the data sides 371~372 may be disposed above and below the pixel area 380. In addition, various designs known to the one of the ordinary skill in the art also can be applied in the present invention, and the details are omitted herein.

Generally speaking, the manufacturing process of the thin-film transistor liquid crystal display (TFT-LCD) includes a TFT array process, a cell process and an assembly process. Wherein, the TFT array process is used for forming the TFT array, the data and scan lines, the shorting bars and the switch device on the glass substrate. The cell process is used for attaching the substrate, the alignment layer and the color filter, and for injecting the liquid crystal material for sealing. The assembly process is used for integrating different modules such as the driving chip, the control chip and the backlight source.

An array test must be performed after the TFT array process is completed. Meanwhile, since the shorting bar buses (e.g. the data shorting bar buses 391~393 and the scan shorting bar buses 331~332) are electrically connected to the signal lines. In addition, the shorting bar buses are used to test the signal lines or the pixels on the TFT-LCD. Moreover, after the array test is completed, the electrical connection between the shorting bar buses on the substrate 300 and the signal lines on the substrate 300*a* is cut off by laser; or in some cases, even the portion outside of the substrate 300*a* is cut off and the substrate 300*a* is the only one that remains.

A cell test is to be performed after the cell process is completed. Meanwhile, the pixels on the TFT-LCD are tested in separate groups through the shorting bars within the shorting bar sets 340~349. After the cell test is completed, the electrical connection between the shorting bar sets 340~349 on the substrate 300*a* and the signal lines is cut off, and the assembly process is subsequently performed.

FIG. 4 schematically shows another embodiment of the data side in FIG. 3. The data side shown in FIG. 4 is a modification of the data side 371 in FIG. 3. For simplicity, the testing pads are omitted here. Referring to FIG. 4, the data side 471 is similar to the data side 371, and the difference is that odd data shorting bar buses 391~393 are disposed on the data side 371 (where three data shorting bar buses are exemplified in FIG. 3), whereas even data shorting bar, buses 491~492 are disposed on the data side 471 (where two data shorting bar buses are exemplified in the present embodiment).

Therefore, the data side 371 uses the data shorting bar buses 391~393 to test the data lines in three different groups during the array test. If the shorting bar sets 340~342 are appropriately connected to the data lines, the R, G, B sub-pixels can be tested through the data shorting bar buses 391~393, respectively. Whereas, the data side 471 uses the data shorting bar buses 491 and 492 to test the data lines in two different groups during the array test. If the shorting bar sets 340~342 are appropriately connected to the data lines, the sub-pixels connected to the odd number and the even data lines can be tested through the data shorting bar buses 491 and 492, respectively. Accordingly, the quantity of the shorting bar buses may be determined based on the physical requirement rather than on the quantity of the sub-pixels in the pixel structure.

FIGS. 5A~5D schematically show other embodiments of the data side in FIG. 3. On the data side of FIG. 3, each shorting bar set includes p shorting bars, and each shorting bar set is electrically connected to p*m data lines, where p=k*n, m is a positive integer, and k=1 or 2. In addition, since the odd number and the even shorting bar buses disposed on the data side may use different method to electrically connect to the shorting bars, the present invention can provide different designs.

Figure 5A:
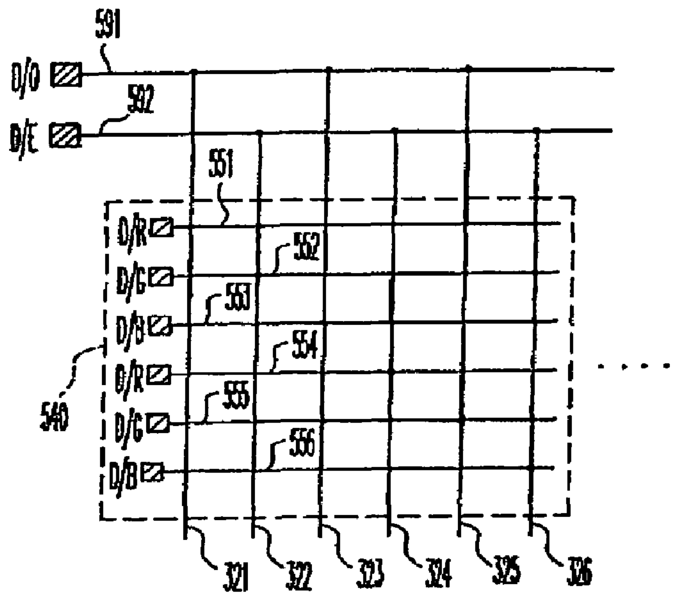

Referring to FIG. 5A, in the present embodiment, n=3, k=2, m=1, thus p=6 and p*m=6. In other words, the shorting bar set 540 may include 6 shorting bars 551~556, and the shorting bars 551~556 are electrically connected to 6 data lines 321~326, respectively. The connection between the shorting bars and the data lines is described hereinafter. Wherein, the shorting bars 551~556 are electrically connected to either the shorting bar bus 591 or 592 depending on whether it is an odd number or an even number. For example, the odd number shorting bars 551, 553 and 555 are electrically connected to the shorting bar bus 591, and the even number shorting bars 552, 554 and 556 are electrically connected to the shorting bar bus 592. Certainly, in addition to the connection method described in the present embodiment, other connection methods also can be used in the present invention.

Figure 5B:
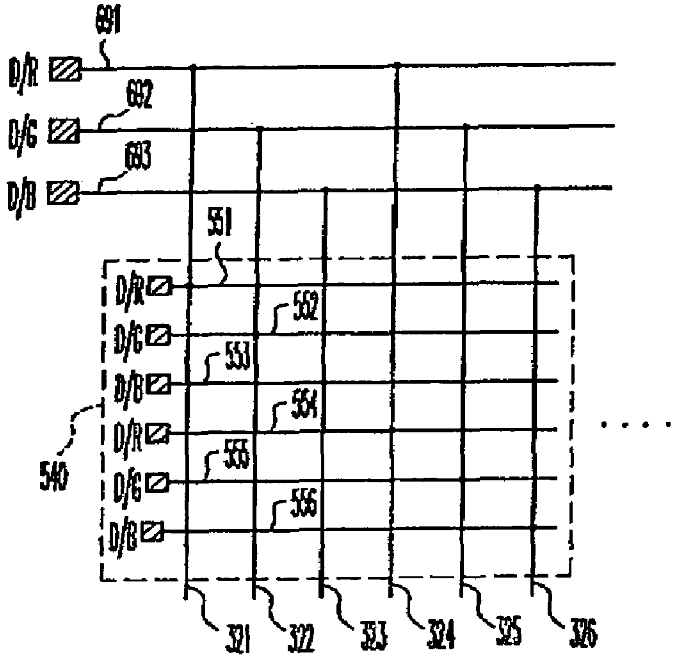

FIG. 5B is similar to FIG. 5A, and the difference is that an even number (e.g. two) of shorting bar buses are disposed in FIG. 5A, whereas an odd number (e.g. three) of shorting bar buses are disposed in FIG. 5B. Therefore, in FIG. 5B, the shorting bars 551~556 are electrically connected to the shorting bar buses 691~693, respectively. For example, the shorting bars 551 and 554 are electrically connected to the shorting bar bus 691, the shorting bars 552 and 555 are electrically connected to the shorting bar bus 692, and the shorting bars 553 and 556 are electrically connected to the shorting bar bus 693. Certainly, in addition to the connection method described in the present embodiment, other connection methods also can be used in the present invention.

Figure 5C:
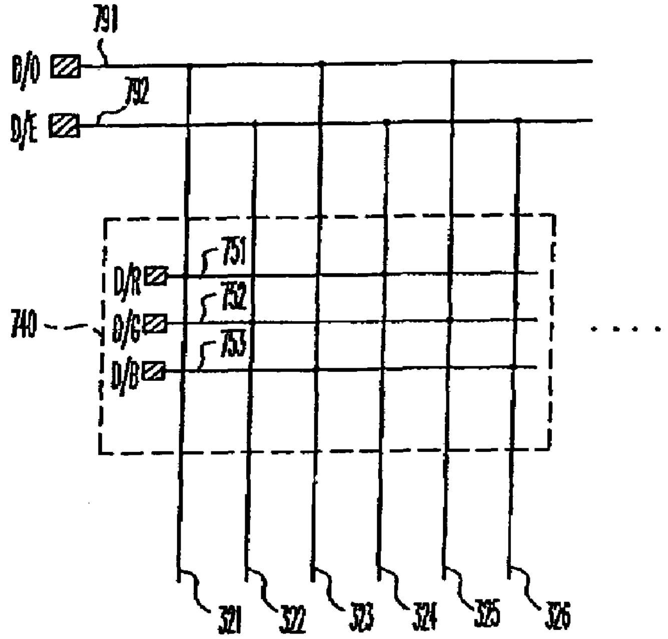

Referring to FIG. 5C, in the present embodiment, n=3, k=1, m=2, thus p=3 and p*m=6. In other words, the shorting bar set 740 may include 3 shorting bars 751~753, and the shorting bars 751~753 are electrically connected to 6 data lines 321~326, respectively. The shorting bars 751~753 are electrically connected to the shorting bar buses depending on whether it is an odd number or an even number, or by using different ordering, grouping or other connection methods. Here, the shorting bars 751~753 are electrically connected to the shorting bar buses 791~792 depending on whether it is an odd number or an even number. Accordingly, the odd numbered and the even numbered objects are separately tested in different groups during the array test, and the R, G, B sub-pixels are tested in different groups during the cell test.

Figure 5D:
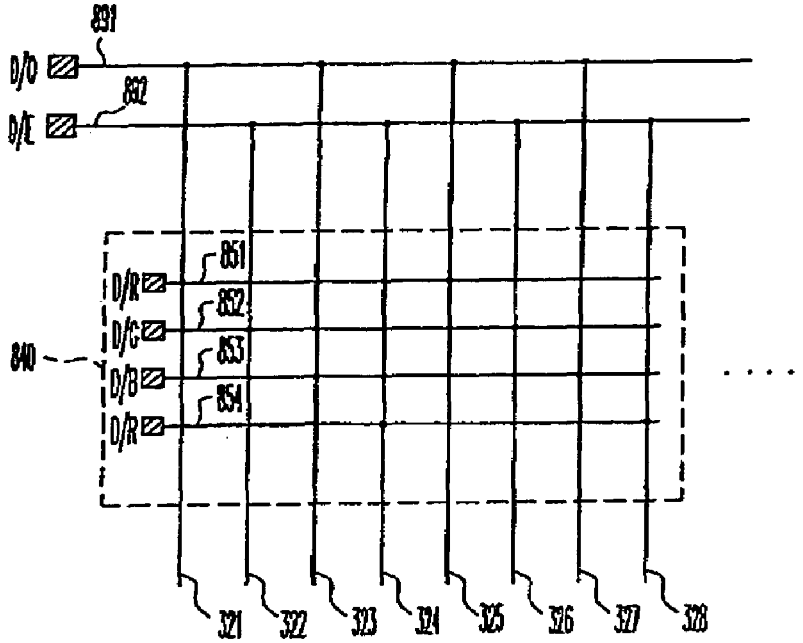

Referring to FIG. 5D, in the present embodiment, n=4, k=1, m=2, thus p=4 and p*m=8. In other words, the shorting bar set 840 may include 4 shorting bars 851~854, and the shorting bars 851~854 are electrically connected to 8 data lines 321~328, respectively. Wherein, the shorting bars 851~854 are electrically connected to the shorting bar buses depending on whether it is an odd number or an even number, or by using different ordering, grouping or other connection methods. Here, the shorting bars 851~854 are electrically connected to the shorting bar buses 891~892 depending on whether it is an odd number or an even number. Accordingly, various designs can be applied to dispose the shorting bar sets on the data side. Moreover, it is also possible to dispose the shorting bar sets that are different from the ones on the data side on the scan side, such that the present invention can provide more various test patterns than the conventional techniques.

Even though the embodiment mentioned above mainly describes the arrangement of the shorting bars on the data side (that includes the data shorting bar buses and the shorting bars in the shorting bar sets). This concept is also suitable for arranging the shorting bars on the scan side (that includes the data shorting bar buses and the shorting bars in the shorting bar sets).

In summary, since the open shorting bars are provided in different groups in the present invention, it is possible to provide the test signals separately to the testing data lines or the scan lines, such that more various test patterns can be provided to determine the existence of crosstalk and flicker, etc., which reduces the risk of the product defect.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A test circuit for a flat panel display device, comprising: a substrate including at least one scan side, at least one data side and a pixel area; a plurality of pixel structures formed in the pixel area, each pixel structure having n sub-pixels, where n is a positive integer; a plurality of signal lines formed on the substrate, each signal line being connected to a corresponding sub-pixel; a plurality of shorting bar sets, being formed on at least one of the at least one scan side and the at least one data side, wherein the shorting bar sets are electrically connected to the signal lines and each shorting bar set is disconnected from each other, wherein the shorting bar sets respectively receive first testing signals corresponding to the signal lines for testing corresponding pixel structures; and a plurality of shorting bar buses being electrically connected to the shorting bar sets, wherein the shorting bar buses respectively receive second testing signals corresponding to the signal lines for testing corresponding pixel structures.

2. The test circuit of claim 1, wherein the signal lines comprise a plurality of data lines.

3. The test circuit of claim 2, wherein each shorting bar set includes:

p shorting bars, each shorting bar set being electrically connected to p*m data lines, where p=k*n, m is a positive integer, and k=1 or 2; and p first testing pads being electrically connected to the p shorting bars, for receiving the first testing signals.

4. The test circuit of claim 3, wherein the shorting bar buses comprise even data shorting bar buses formed on the at least one data side, and each even data shorting bar bus includes a plurality of second testing pads which are adapted to receive the second testing signals.

5. The test circuit of claim 4, wherein the p shorting bars of each shorting bar set are electrically connected to the even data shorting bar buses, respectively.

6. The test circuit of claim 3, wherein the shorting bar buses comprise odd data shorting bar buses formed on the at least one data side, and each odd data shorting bar bus includes a plurality of second testing pads which are adapted to receive the second testing signals.

7. The test circuit of claim 6, wherein the p shorting bars of each shorting bar set are electrically connected to the odd data shorting bar buses, respectively.

8. The test circuit of claim 1, wherein the signal lines comprise a plurality of scan lines.

9. The test circuit of claim 8, wherein each shorting bar set includes:

p' shorting bars, each shorting bar set being electrically connected to p'*m' scan lines, where p' is greater than or equal to 2, and m' is a positive integer; and p' first testing pads being electrically connected to the p' shorting bars, for receiving the first testing signals.

10. The test circuit of claim 9, wherein the shorting bar buses comprise at least two scan shorting bar buses formed on the at least one scan side, wherein the at least two scan shorting bar buses are electrically connected to the p' shorting bars of each shorting bar set, respectively, and each scan shorting bar bus includes a plurality of second testing pads which are adapted to receive the second testing signals.

11. A test circuit for a flat panel display device, comprising:

a substrate including at least one scan side and a pixel area; a plurality of pixel structures formed in the pixel area, each pixel structure having n sub-pixels, where n is a positive integer; a plurality of data lines formed on the substrate, each data line being connected to a corresponding sub-pixel; a plurality of scan lines formed on the substrate, and substantially intersected with the data lines; a plurality of scan shorting bar sets, being formed on the at least one scan side, wherein the scan shorting bar sets are electrically connected to the scan lines and each scan shorting bar set is disconnected from each other, wherein the scan shorting bar sets respectively receive first testing signals corresponding to the scan lines for testing corresponding pixel structures; and a plurality of shorting bar buses, being electrically connected to the scan shorting bar sets, wherein the shorting bar buses respectively receive second testing signals corresponding to the scan lines for testing corresponding pixel structures.

12. The test circuit of claim 11, wherein each scan shorting bar set includes:

p' shorting bars, each shorting bar set being electrically connected to p'*m' scan lines, where p' is greater than or equal to 2, and m' is a positive integer; and p' first testing pads being electrically connected to the p' shorting bars, for receiving the first testing signals.

13. The test circuit of claim 12, wherein the shorting bar buses comprise at least two scan shorting bar buses formed on the at least one scan side, wherein the at least two scan shorting bar buses are electrically connected to the p' shorting bars of each scan shorting bar set, respectively, and each scan shorting bar bus includes a plurality of second testing pads which are adapted to receive the second testing signals.

14. The test circuit of claim 11, further comprising:

at least one data side formed on the substrate, wherein the at least one data side includes a plurality of data shorting bar sets, and the data shorting bar sets are electrically connected to the data lines, respectively, and each data shorting bar set is disconnected from each other, and the data shorting bar sets are used for respectively receiving third testing signals to corresponding data lines for testing corresponding pixel structures.

15. The test circuit of claim 14, wherein each data shorting bar set includes:

p shorting bars, each data shorting bar set being electrically connected to p*m data lines, where p=k*n, m is a positive integer, and k=1 or 2; and p first testing pads being electrically connected to the p shorting bars, for receiving the third testing signals.

16. The test circuit of claim 15, wherein the shorting bar buses comprise even data shorting bar buses formed on the at least one data side and being electrically connected to the data shorting bar sets, and each even data shorting bar bus includes a plurality of second testing pads which are adapted to receive the second testing signals.

17. The test circuit of claim 16, wherein the p shorting bars of each data shorting bar set are electrically connected to the even data shorting bar buses, respectively.

18. The test circuit of claim 15, wherein the shorting bar buses comprise odd data shorting bar buses formed on the at least one data side and being electrically connected to the data shorting bar sets, and each odd data shorting bar bus includes a plurality of second testing pads which are adapted to receive the second testing signals.

19. The test circuit of claim 18, wherein the p shorting bars of each data shorting bar set are electrically connected to the odd data shorting bar buses, respectively.

* * * * *